(12) United States Patent
Hasunuma

(10) Patent No.: US 6,504,192 B2
(45) Date of Patent: Jan. 7, 2003

(54) SEMICONDUCTOR DEVICE

(75) Inventor: Eiji Hasunuma, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/888,389

(22) Filed: Jun. 26, 2001

(65) Prior Publication Data

US 2002/0074579 A1 Jun. 20, 2002

(30) Foreign Application Priority Data

Dec. 20, 2000 (JP) ........................... 2000-386979

(51) Int. Cl.⁷ .................... H01L 29/76; H01L 29/94; H01L 31/062; H01L 31/113; H01L 31/119
(52) U.S. Cl. ................ 257/288; 257/344; 438/230; 438/303; 438/595
(58) Field of Search ..................... 257/288, 339, 257/344; 438/230, 301, 303, 289, 14, 595

(56) References Cited

U.S. PATENT DOCUMENTS 5,863,824 A * 1/1999 Gardner et al. ............. 438/303
6,133,132 A * 10/2000 Toprac et al. ............... 438/595
6,232,189 B1 * 5/2001 Yi et al. ..................... 438/301
6,409,879 B1 * 6/2002 Toprac et al. ........... 156/345.24

FOREIGN PATENT DOCUMENTS

| JP | 8-32058 | 2/1996 |
|---|---|---|
| JP | 10-12881 | 1/1998 |

* cited by examiner

Primary Examiner—David Nelms
Assistant Examiner—Andy Huynh
(74) Attorney, Agent, or Firm—McDermott, Will & Emery

(57) ABSTRACT

With respect to a desired gate electrode (A) and dummy gate electrodes (B, C), side wall spacers (3a, 3b, 3c) of the respective gate electrodes are formed by dry etching such as an RIE method, and the etching characteristic at the time of formation of the side wall spacer is utilized so that the side wall spacer width of the desired gate electrode is controlled by adjusting gap differences between the gate electrodes by properly arranging the dummy electrode; and thus, it is possible to obtain desired transistor characteristics.

9 Claims, 7 Drawing Sheets

SEMICONDUCTOR DEVICE

BACKGROUND OF THE INVENTION

1. Field of the Invention

The present invention generally relates to a semiconductor device having a transistor, and more particularly, to a semiconductor device which has an insulating-gate-type field-effect transistor of an LDD structure with a side wall formed therein and which is allowed to have desired transistor characteristics by placing a dummy electrode to control a width of the side wall of the gate electrode, and to a manufacturing method for such a semiconductor device.

2. Description of the Prior Art

In recent years, along with increasing degree of integration in an integrated circuit, a gate length of a transistor has been shortened, and as the result of this, there occur short channel effect and hot carrier effect. Therefore, there has come to be widely used a LDD (Lightly Doped Drain) structure, that is, a structure in which impurity density at a drain diffusion region in the vicinity of the gate electrode is lowered as compared with the impurity density at the other regions.

Not only in the MOS-type transistors, but also in semiconductor devices (multi-input-gate type MIS devices) formed by placing a plurality of gate electrodes on the same substrate in parallel with each other and connecting a plurality of MIS transistors in series with each other, the above-mentioned LDD structure has come to be applied to each of the MIS transistors.

Conventionally, with respect to the semiconductor device having an insulating-gate-type field-effect transistor (hereinafter, referred to as MISFET), in the case where a film facing a side face of the gate electrode is formed by dry etching such as an RIE method, that is, a side wall spacer is formed, as indicated by its cross-section shown in FIG. 14, since reaction products at the time of etching are allowed to deposit more thickly at positions having greater gaps between the gate electrodes 2, the width of the side wall spacer 3a is widened. On the other hand, as illustrated in FIG. 15, at positions where the gaps between the gate electrodes 2 are dense, since the deposition of the reaction products is small, the width of the side wall spacer 3a' becomes narrower. Consequently, differences (deviations) occur in the width of the side wall spacer 3a due to differences in the density of the gaps between the gate electrodes.

In the present invention, this deviation characteristic at the time of formation of the side wall is referred to as "etching characteristic in the side wall width", or simply referred to as "etching characteristic". In particular, in the case of the transistor using the LDD structure, the occurrence of deviations in the width of the side wall spacer 3a causes a difference in the source-drain structure, resulting in a difference in the transistor characteristics and there arise subsequent deviations in the characteristics. In the transistor using the LDD structure, the setting of the width of the side wall spacer is one of essential factors for determining the transistor characteristics. The present invention has been devised to solve the above-mentioned problem, and its objective is to realize a semiconductor device which can provide desired transistor characteristics by controlling the width of the side wall spacer, and also to provide a semiconductor device which becomes free from deviations in the transistor characteristics by eliminating deviations in the width of the side wall spacer due to differences in the density of the layout gaps between the gate electrodes.

As described above, the present invention provides a structure of a semiconductor device and a manufacturing method thereof, where the width of the side wall spacer is controlled or properly adjusted so as to eliminate deviations occurring in the transistor characteristics or to effectively utilize the difference occurring in the transistor characteristics to obtain desired transistor characteristics.

SUMMARY OF THE INVENTION

In order to achieve the above-mentioned objectives, the present invention adjusts differences in density of layout gaps between gate electrodes by properly arranging a dummy electrode so that a width of a side wall spacer is controlled and transistor characteristics are adjusted.

According to a first aspect of the present invention, a semiconductor device which has a transistor having a side wall spacer formed, comprises: a gate array in which a gap between a desired gate electrode and an adjacent electrode is adjusted in difference; wherein a width of the side wall spacer is controlled by adjusting the gap in difference while an effective channel length of the transistor is maintained constant, whereby characteristics of the transistor are adjusted.

In this construction, the gap difference between gate electrodes is adjusted by providing a dummy electrode in the vicinity of the desired gate electrode or by an arrangement of having no dummy electrode provided in the vicinity of the desired gate electrode.

The gap difference between gate electrodes may be eliminated by providing a dummy electrode in the vicinity of the desired gate electrode, thereby obtaining a constant width of the side wall spacer.

The gap difference between gate electrodes may be changed by providing a dummy electrode in the vicinity of the desired gate electrode, thereby changing the width of the side wall spacer.

In accordance with the above-mentioned arrangement, by eliminating differences in density of providing the gate electrodes, the same width of the side wall spacer can be obtained, and it is possible to provide a semiconductor device having uniform transistor characteristics.

According to a second aspect of the present invention, a method of manufacturing a semiconductor device having a transistor formed with a side wall spacer, comprises the steps of: carrying out a patterning process by dry etching using a photoresist mask to form gate electrodes on a substrate; stacking a silicon dioxide insulating film covering upper face and side faces of each gate electrode to coat an entire exposed surface on the substrate; and forming a side wall spacer of each gate electrode by dry etching, wherein a gap between the gate electrodes is adjusted in difference so that a width of the side wall spacer is controlled due to etching characteristics during the formation of the side wall spacer.

In this method, an effective channel length of the transistor is defined by a space distance between low-density impurity regions thereof that have been formed by injection prior to the formation of the side wall spacer, and the width of the side wall spacer is controlled while maintaining constant.

In the arrangement and method of the present invention make, it possible to realize a structure of a semiconductor device and a manufacturing method thereof which can adjust the distance in which a dummy electrode is arranged so that it becomes possible to control the width of the side wall spacer, and consequently to provide desired transistor characteristics.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE INVENTION

Embodiment 1

Figure 1:
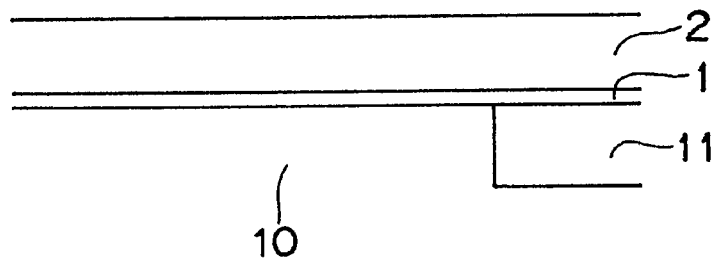
FIG. 1 is a cross-sectional view showing a manufacturing process of a semiconductor device in accordance with the present invention.

Referring to FIGS. 1 to 7, the following description will discuss a first embodiment of the present invention. Here, in the respective drawings, those members that are common and have the same functions are indicated by the same reference numerals, and overlapped explanations will be omitted. In FIGS. 1 to 7, reference numeral 1 is a silicon dioxide film, 2 is a silicon film, 3 is a silicon insulating film, 10 is a semiconductor substrate, 11 is an isolation region, A is a desired gate electrode, B and C are dummy gate electrodes, and 21 and 22 are impurity regions.

With respect to a semiconductor device having the above-mentioned arrangement, an explanation will be given of a manufacturing method thereof. First, as illustrated in FIG. 1, an element isolation region 11 is formed in the semiconductor substrate 10 by using a known embedding method, etc. for a thermal oxidation film and an oxidation film. In the semiconductor substrate 10, portions other than the isolation region 11 form active regions.

Thereafter, the substrate surface is thermally oxidized to form a silicon dioxide film 1, which forms a gate insulating film. Next, a silicon film 2 is stacked on the entire upper surface of the silicon dioxide film 1 to form an electrode layer 2 used for a gate electrode. Here, the silicon dioxide film 1 is a thermal oxidation film or a non-dope silicon oxidation film that has been stacked by a reduced-pressure and normal-pressure CVD (Chemical Gaseous Phase Epitaxy Method), with a film thickness of 3 to 20 nm. The silicon film 2 is composed of poly-crystal silicon or amorphous silicon deposited by a CVD method, that is, for example, a film formed by subjecting phosphor (P), arsenic (As), etc. to a doping process, or a silicide film of a high-melting-point metal film of titanium (Ti), titanium nitride (TiN), tungsten (W), etc., or a superposed (laminated) film of these, or a conductive metal film of W, Al, etc, and has a film thickness of 50 to 500 nm.

Figure 2:
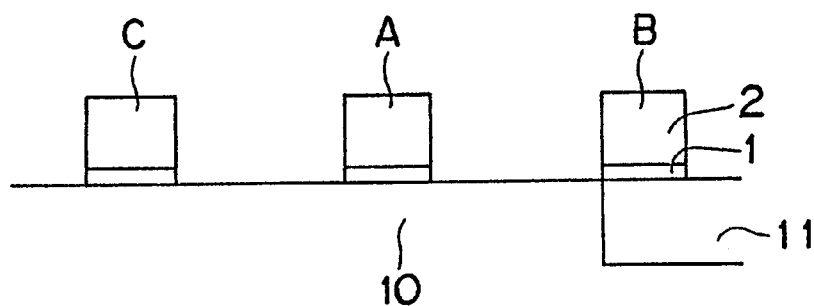
FIG. 2 is a cross-sectional view showing a further manufacturing process of a semiconductor device in accordance with the present invention.

Next, as illustrated in FIG. 2, this is subjected to a patterning process by dry etching such as an RIE (reactive ion etching) method, etc., using photoresist masks so that gate electrodes 2 (A, B, C) are formed. At this time, dummy gate electrodes B and C are patterned and formed by using the photoresist masks at properly spaced positions on both sides of the desired gate electrode A.

Figure 3:
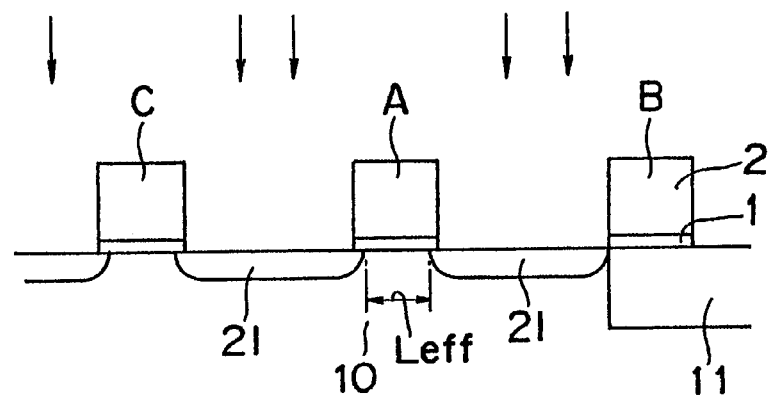
FIG. 3 is a cross-sectional view showing a further manufacturing process of a semiconductor device in accordance with the present invention.

Next, as illustrated in FIG. 3, impurities are injected by using an ion injection method to form a first impurity region (low-density region) 21 by impurity doping. For example, in the case of an nMOS transistor, this impurity region 21 is formed by injecting P, As, etc., and in the case of a pMOS transistor, it is formed by injecting boron (B), boron fluoride ($BF_2$), etc.

Figure 4:
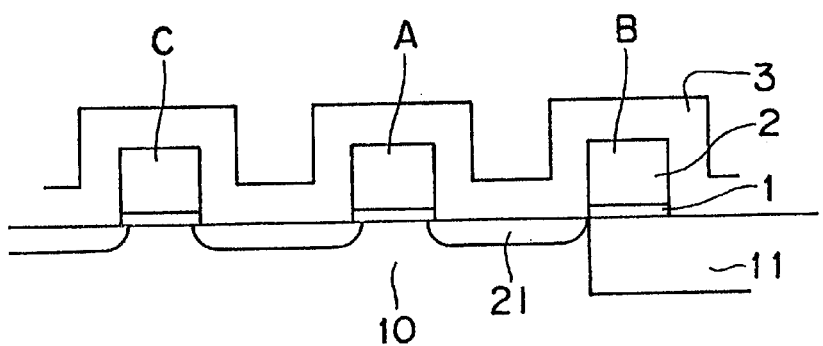
FIG. 4 is a cross-sectional view showing a further manufacturing process of a semiconductor device in accordance with the present invention.

As illustrated in FIG. 4, an insulating layer 3 of a silicon dioxide film is stacked covering the upper face and side faces of each gate electrode 2 therewith; thus, the entire exposed surfaces including the gate electrodes, isolation region 11 and impurity region 21 on the semiconductor substrate 10 are coated with this silicon dioxide film 3. The silicon dioxide film 3 is an insulating film, such as a TEOS oxidation film and a nitride film, that is stacked by a reduced-pressure and normal-pressure CVD method, or a superposed film of these films, and has a film thickness of 10 to 500 nm.

Figure 5:
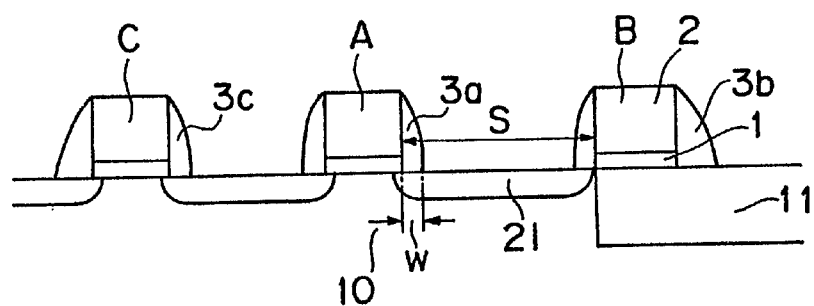
FIG. 5 is a cross-sectional view showing a further manufacturing process of a semiconductor device in accordance with the present invention.

Next, as illustrated in FIG. 5, with respect to the desired gate electrode A, dummy gate electrodes B and C, etc., only the silicon dioxide insulating film 3 coating the side faces of each gate electrode is left, and the other portions of the film 3 are etched and removed by dry etching such as an RIE method, so that the side wall spacers 3a, 3b and 3c of the gate electrodes A, B and C are formed.

Figure 6:
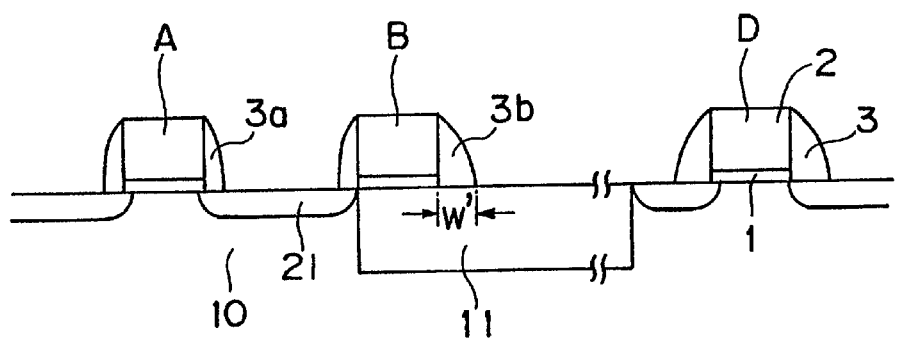
FIG. 6 is a cross-sectional view of an essential portion for explaining a side wall width adjustment in the semiconductor device of the present invention.

In this case, as illustrated in FIG. 6, in the case when the gap between the gate electrode B and the adjacent gate electrode D is great than the gap S with respect to the adjacent gate electrode A, the side wall spacer 3b of the gate electrode B has a width wider (w'>w) than that of the side wall spacer 3a of the gate electrode A with a narrower gap to the adjacent gate electrode. This is because more reaction products at the time of etching are allowed to deposit on the side with a wider gap to the next gate electrode D (the side wall width etching characteristic).

In other words, with respect to the desired gate electrode A, by placing the dummy gate electrode B with an appropriate gap from the desired gate electrode A, the side wall width can be adjusted by utilizing the etching characteristic at the time of formation of the side wall; thus, it is possible to obtain the side wall spacer 3a that has no difference in width.

Figure 7:
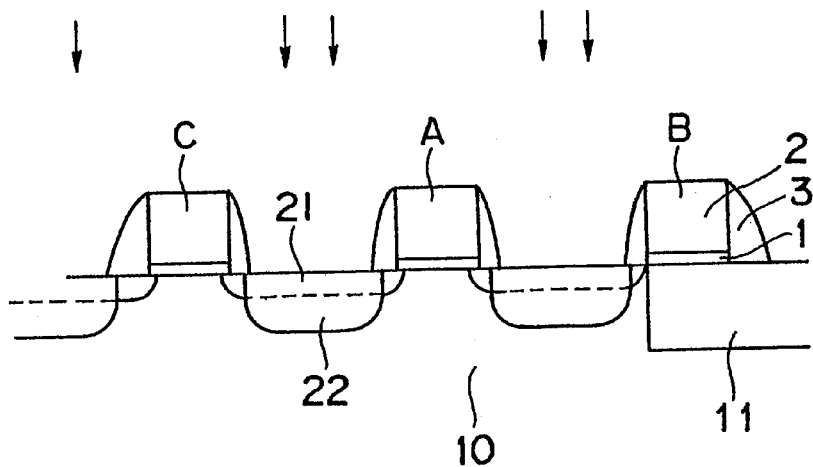
FIG. 7 is a cross-sectional view showing a further manufacturing process of a semiconductor device in accordance with the present invention.
Figure 8:
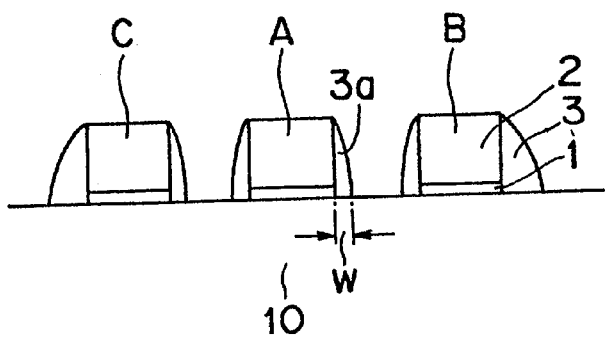
FIGS. 8A and 8B are cross-sectional views of a semiconductor device in accordance with second and third embodiments of the present invention.
Figure 8:
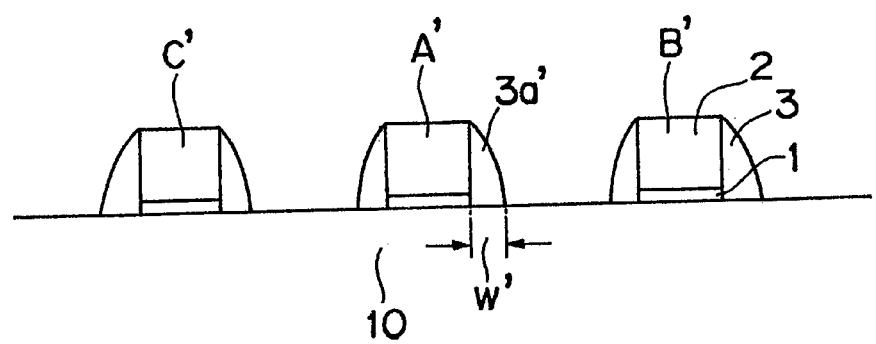

Next, as illustrated in FIG. 7, a second impurity region 22 of high-density is formed in the semiconductor substrate 10 by injecting impurities deeper than the first impurity region 21 by using an ion injection method, thereby forming a transistor of the LDD structure. In the same manner as the first impurity region 21, the second impurity region 22 is formed by injecting phosphor (P), arsenic (As), etc. in the case of the nMOS transistor while injecting boron (B), boron fluoride ($BF_2$), etc. in the case of the pMOS transistor, thereby forming an impurity diffusion layer region by doping.

As described above, in the present embodiment, by placing a dummy electrode with an appropriate gap from a desired gate electrode, it is possible to eliminate deviations in the side wall space width due to deviations in the density of the gate electrodes, and consequently to realize a semiconductor device having stable transistor characteristics by eliminating a difference in the source-drain structure in the transistor of the LDD structure.

Embodiment 2

Referring to FIG. 1 to FIGS. 8A, 8B and FIGS. 9A, 9B, an explanation will be given of a second embodiment of the present invention. Here, with respect to these drawings, those members that are common and have the same functions are indicated by the same reference numerals, and overlapped explanations will be omitted.

Figure 9:
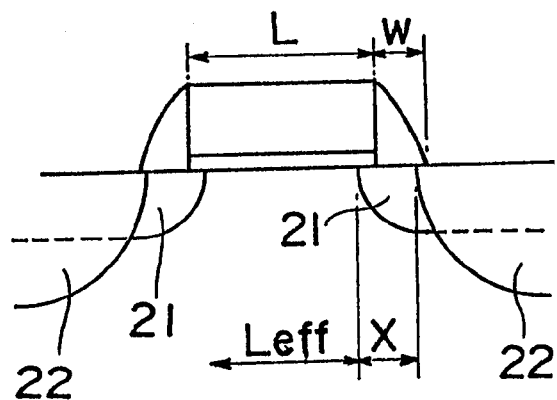
FIGS. 9A and 9B are cross-sectional views of an essential portion for explaining a side wall width adjustment in the semiconductor device of the present invention.
Figure 9:
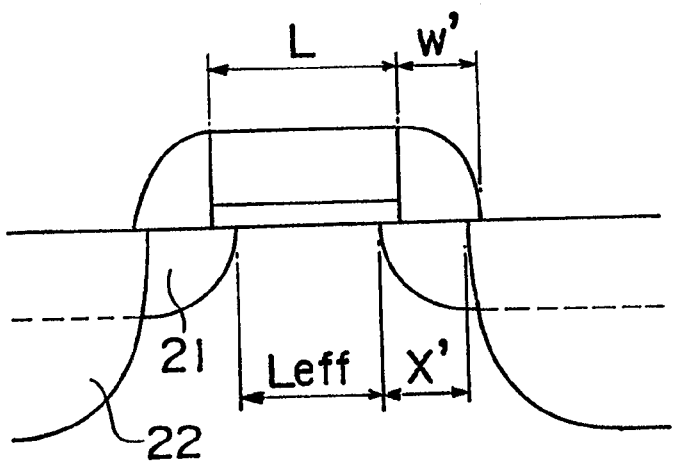

In general, as illustrated in FIG. 9A, in the case where the side wall spacers of the respective gate electrodes are formed, only the silicon oxidation insulating film coating the side faces of each gate electrode is left to remain with the other portions being etched and removed by dry etching such as an RIE method (see FIGS. 5, 6 and 7). In the meanwhile, since the transistor of the LDD structure is used in the present invention, the effective channel length Leff is determined by the gap between the first impurity regions 21 of a low density that have been injected into the substrate 10 prior to the formation of the side wall film (see FIG. 3). Therefore, with the length Leff being set to constant, the side wall width w is changed to w' as shown in FIG. 9B so that the width X of the low-density impurity region 21 that is determined by the second impurity region 22 can be changed to X', thereby making it possible to provide desired transistor characteristics.

In this case, with respect to the length Leff, if the gate length L is the same, Leff is also the same, and the width X of the impurity region is determined by the side wall width w; thus, if w becomes greater, X also becomes greater.

In FIG. 8A, A represents a desired gate electrode, B and C are dummy gate electrodes, and 3a represents a side wall spacer of the desired gate electrode A. Moreover, in FIG. 8B, A' represents a desired gate electrode, B' and C' are dummy gate electrodes, and 3a' represents a side wall spacer of the desired gate electrode A'.

With respect to the manufacturing method of the semiconductor device of the present embodiment, since it is the same as that in the first embodiment, the explanation thereof is omitted here.

The present embodiment has a specific features that, by utilizing the etching characteristic at the time of formation of the side wall, explained by using FIGS. 9A and 9B, the side wall spacer width of the desired gate electrode is controlled by adjusting the gap S of location of the dummy gate electrode with respect to the location of the desired electrode.

For example, as illustrated in FIG. 8A, the location gap of the dummy gate electrodes B and C with respect to the location of the desired electrode A is narrowed so that the width w of the side wall spacer 3a of the desired gate electrode A is narrowed. On the other hand, as illustrated in FIG. 8B, the location gap of the dummy gate electrodes B' and C' from the desired gate electrode A' is widened so that the width w' of the side wall spacer 3a' of the desired gate electrode A' is made wider compared to the width w of the side wall spacer 3a shown FIG. 8A.

Here, in the present embodiment, the width of the side wall spacer can be changed by placing no dummy electrode with respect to the desired gate electrode.

In this manner, in the present embodiment, by placing the dummy gate electrode so as to provide a difference in density in the layout gaps of the gate electrodes location, or by placing no dummy gate electrode in one side of the desired gate electrode, a difference in the side wall spacer width is obtained. Thus, it becomes possible to change the width X in the impurity region of the low density, and consequently to change the transistor characteristics. Thus, it is possible to realize a semiconductor device having desired transistor characteristics.

Embodiment 3

Referring to FIG. 1 to FIGS. 8A, 8B also used in the explanation of embodiment 2, an explanation will be given of a third embodiment of the present invention. Here, with respect to these drawings, those members that are common and have the same functions are indicated by the same reference numerals, and overlapped explanations will be omitted.

As illustrated in FIG. 8A, A represents a gate electrode of a transistor requiring a high driving capability, B and C are dummy gate electrodes, and reference numeral 3a represents a side wall spacer of the desired gate electrode A. Meanwhile, in FIG. 8B, A' represents a gate electrode of a transistor requiring a low leak, B' and C' are dummy gate electrodes, and reference numeral 3a' represents a side wall spacer of the gate electrode A'. With respect to the manufacturing method of the semiconductor device of the present embodiment, the same processes as those of the first embodiment are carried out.

In the same manner as embodiment 2, the present embodiment has a specific feature that, by utilizing the etching characteristic at the time of formation of the side wall, explained with reference to FIGS. 9(a) and 9(b), the side wall spacer width of the desired gate electrode is controlled by adjusting the gap S of locating the dummy gate electrodes with respect to the desired gate electrode. Thus, it is possible to adjust the layout of the dummy gate electrode in accordance with the transistor characteristics to be used.

In other words, as illustrated in FIG. 8A, in the case of a transistor requiring a high driving capability, the gaps of locating the dummy gate electrodes B and C are narrowed. On the other hand, as illustrated in FIG. 8B, in the case of a transistor requiring a low leak, the gaps of locating the dummy gate electrodes B' and C' are widened. In this manner, by adjusting the layout construction of the dummy electrode in accordance with the transistor characteristics to be used, it is possible to realize a semiconductor in which the width of the side wall is changed.

Embodiment 4

Referring to FIGS. 1 to 7 as well as FIGS. 10A and 10B, an explanation will be given of a fourth embodiment of the present invention. Here, with respect to these drawings, those members that are common and have the same functions are indicated by the same reference numerals, and overlapped explanations will be omitted.

Figure 10:
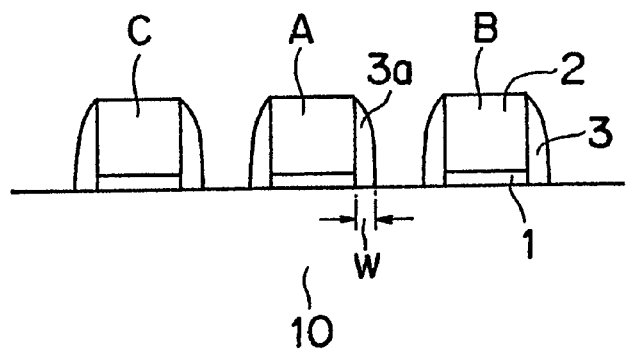
FIGS. 10A and 10B are cross-sectional views of a semiconductor device in accordance with a fourth embodiment of the present invention.
Figure 10:
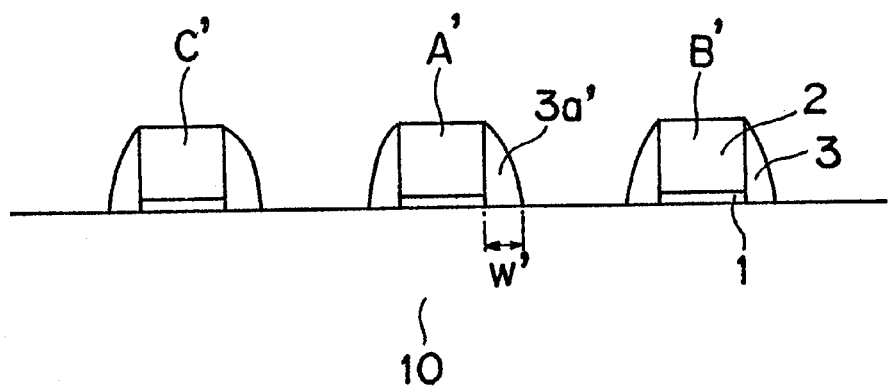

As illustrated in FIG. 10A, A, B and C represent gate electrodes of a transistor requiring a high driving capability, and 3a represents a side wall spacer of the gate electrode A. On the other hand, in FIG. 10B, A', B' and C' represent gate electrodes of a transistor requiring a low leak, and reference numeral 3a' represents a side wall spacer of the gate electrode A'. With respect to the manufacturing method of the semiconductor device of the present embodiment, the same processes as those of the first embodiment are carried out.

The present embodiment has a specific feature that the layout of the gate electrodes (transistors) is adjusted in accordance with the transistor characteristics to be used. In other words, the present embodiment is different from the embodiment 3 in that, in embodiment 3, a dummy gate electrode is placed and the location thereof is adjusted, while in the present embodiment, not a dummy, but a gate electrode (transistor) is placed and the location thereof is adjusted.

In other words, as illustrated in FIG. 10A, in the case of a transistor A requiring a high driving capability, the gaps of locating the adjacent gate electrodes B and C are narrowed with respect to the transistor A. On the other hand, as illustrated in FIG. 10B, in the case of a transistor A' requiring a low leak, the gaps of locating the adjacent gate electrodes B' and C' are widened. In this manner, by adjusting the layout construction of the gate electrodes (transistor) in accordance with the transistor characteristics to be used, it is possible to realize a semiconductor in which the width of the side wall spacer is changed (w'>w).

Embodiment 5

Referring to FIGS. 1 to 7 as well as FIGS. 11 and 12, an explanation will be given of a fifth embodiment of the present invention. Here, with respect to these drawings, those members that are common and have the same functions are indicated by the same reference numerals, and overlapped explanations will be omitted.

Figure 11:
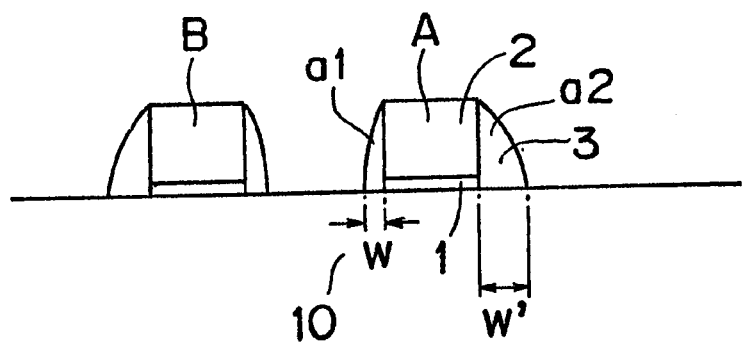
FIG. 11 is a cross-sectional view of a semiconductor device in accordance with fifth and sixth embodiments of the present invention.

As illustrated in FIG. 11, A is a gate electrode of a desired transistor and B is a dummy gate electrode, and of the side wall spacers a1 and a2 on both sides of the desired gate electrode A, a1 represents the side wall spacer on a layout side of the gate electrode A facing to the dummy gate electrode B, and a2 represents the side wall spacer on the other side of the gate electrode A without a dummy gate electrode. With respect to the manufacturing method of the semiconductor device of the present embodiment, the same processes as those of the first embodiment are carried out.

The present embodiment has a specific feature that, by placing the dummy gate electrode on only one side of the desired gate electrode A, it is possible to form a transistor having the side wall spacers with different widths on the right and left sides (w<w').

Figure 12:
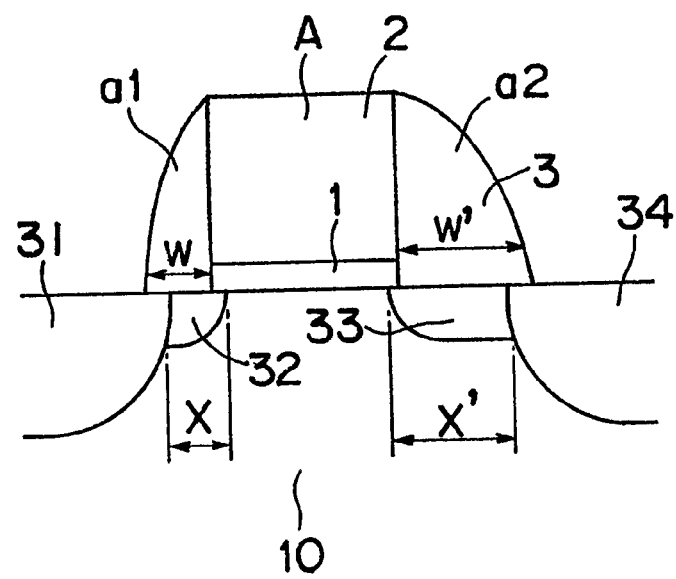
FIG. 12 is a cross-sectional view of a semiconductor device in accordance with fifth and sixth embodiments of the present invention.

Referring to FIG. 12, an explanation will be given of the features of the transistor in accordance with the present embodiment. In this Figure, reference numerals 31 and 34 represent regions having a high impurity density in the LDD structure, and 32 and 33 represent regions having a low impurity density. Here, in the case where the high-density region 31 serves as a source and the high-density region 34 serves as a drain, since the width X of the low-density region 32 is shorter than the width X' of the low density region 33, there is no drop in current due to a parasitic resistance of the low-density region 32, and since the electric field in the low-density region 33 is small, a transistor having high hot-carrier resistance is obtained.

Embodiment 6

Referring to FIGS. 1 to 7 as well as FIGS. 11 to 13, an explanation will be given of a sixth embodiment of the present invention. Here, with respect to these drawings, those members that are common and have the same functions are indicated by the same reference numerals, and overlapped explanations will be omitted.

Figure 13:
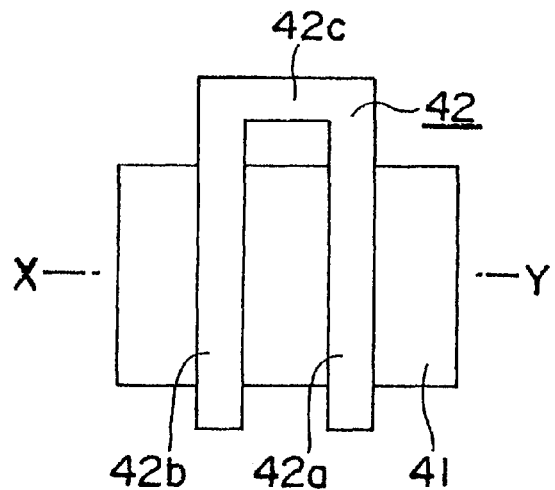
FIG. 13 is a top view of a semiconductor device in accordance with a sixth embodiment.
Figure 14:
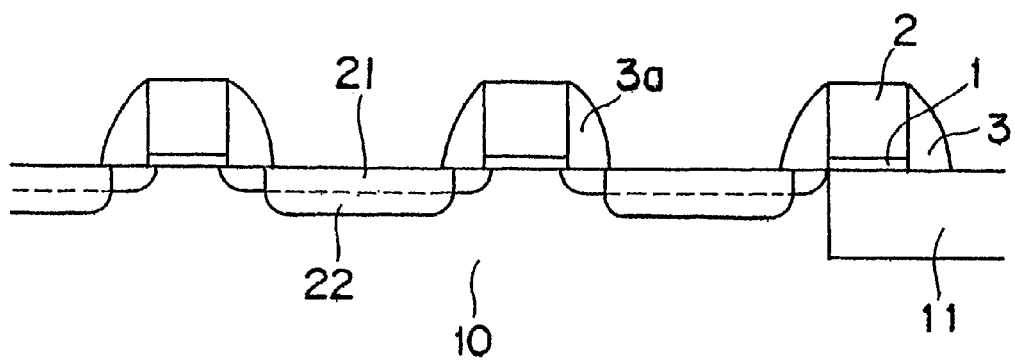
FIG. 14 is a cross-sectional view of a conventional semiconductor device.
Figure 15:
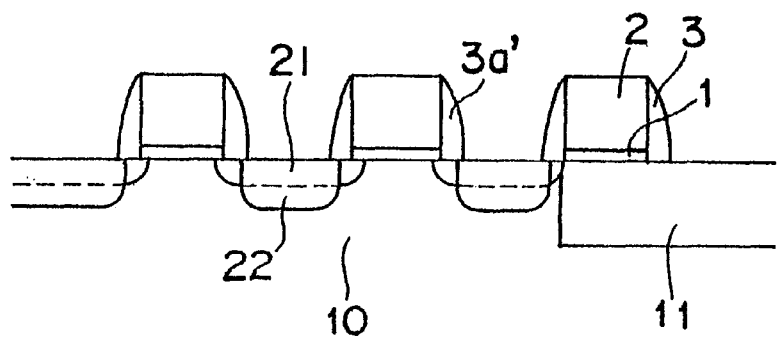
FIG. 15 is a cross-sectional view of a further conventional semiconductor device.

In FIG. 13, reference numeral 41 represents an active region, and 42 is a gate electrode. Moreover, FIG. 11 shows a cross-section taken along X-Y direction in FIG. 13. In more detail, the gate electrode 42 has a first intersecting section 42a and a second intersecting section 42b, and the first intersecting section 42a and second intersecting section 42b are connected by a connecting section 42c to form an integrated structure. Here, the first intersecting section 42a and the second intersecting section 42b respectively correspond to the gate electrodes A and B in FIG. 11. With respect to the manufacturing method of the semiconductor device of the present embodiment, the same processes as those of the first embodiment are carried out.

The present embodiment has a specific feature that, as illustrated in FIG. 13, the desired gate electrode 42 is placed, with its upper face bent into a U-letter shape so as to allow the desired gate electrode 42 to intersect the active region 41, so that the desired gate electrode 42 itself is allowed to commonly function as a dummy gate electrode. In this arrangement, without placing a dummy gate electrode, it is possible to form a transistor having the side wall spacers with different widths on the right and left sides as illustrated in FIG. 11. Thus, it becomes possible to realize a semiconductor device having high hot-carrier resistance.

In accordance with the first aspect of the present invention, by eliminating differences in width of the side wall spacer due to differences in density of the gate electrodes, it is possible to provide a semiconductor device having a uniform transistor characteristic and a manufacturing method for such a device.

In accordance with the second aspect of the present invention, by providing differences in density in the layout gaps between the gate electrodes, it is possible to realize a semiconductor device that effectively utilizes differences occurring in the transistor characteristics, and a manufacturing method thereof.

In accordance with the third aspect of the present invention, in the case of a transistor requiring a high driving capability, the gaps of locating the dummy gate electrodes are narrowed, and in the case of a transistor requiring a low leak, the gaps of locating the dummy gate electrodes are widened, so that the layout structure of the dummy gate electrode is adjusted in accordance with the characteristics of a transistor to be used, and it is possible to realize a semiconductor device in which the side wall width is changed.

In accordance with the fourth aspect of the present invention, in the case of a transistor requiring a high driving capability, the gaps of locating the adjacent gate electrodes are narrowed, and in the case of a transistor requiring a low leak, the gaps of locating the adjacent gate electrodes are widened, so that the layout structure of the gate electrode (transistor) is adjusted in accordance with the characteristics of a transistor to be used. Thus, it is possible to realize a semiconductor device in which the side wall spacer width is changed.

In accordance with the fifth aspect of the present invention, by placing a dummy gate electrode on only one side of the desired gate electrode, it is possible to form a transistor having the side wall spacers with different widths on the right and left sides, and consequently to obtain a transistor having high hot-carrier resistance.

In accordance with the sixth aspect of the present invention, the desired gate electrode is bent into a U-letter shape and placed so as to allow it to intersect the active region, so that the desired gate electrode itself also serves as a dummy gate electrode commonly. In this arrangement, without placing a dummy gate electrode, it is possible to form a transistor having the side wall spacers with different widths on the right and left sides. Thus, it becomes possible to realize a semiconductor device having high hot-carrier resistance.

As described above, the present invention adjusts differences in density of the layout gaps between the gate electrodes by properly arranging the dummy gate electrode so that the width of the side wall spacer is controlled and the transistor characteristics are adjusted.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor device which has a transistor having a side wall spacer formed, comprising:

a gate array in which a gap between a desired gate electrode and an adjacent electrode is adjusted in difference;

wherein a width of the side wall spacer is controlled by adjusting the gap in difference while an effective channel length of the transistor is maintained constant, whereby characteristics of the transistor are adjusted.

2. The semiconductor device according to claim 1, wherein the gap difference between gate electrodes is adjusted by providing a dummy electrode in the vicinity of the desired gate electrode.

3. The semiconductor device according to claim 1, wherein the gap difference between gate electrodes is adjusted by an arrangement of having no dummy electrode provided in the vicinity of the desired gate electrode.

4. The semiconductor device according to claim 2, wherein the gap difference between gate electrodes is eliminated by providing a dummy electrode in the vicinity of the desired gate electrode, thereby obtaining a constant width of the side wall spacer.

5. The semiconductor device according to claim 2, wherein the gap difference between gate electrodes is changed by providing a dummy electrode in the vicinity of the desired gate electrode, thereby changing the width of the side wall spacer.

6. The semiconductor device according to claim 5, wherein the gap difference between gate electrodes is changed by providing a dummy electrode in the vicinity of the desired gate electrode, thereby changing the width of the side wall spacer in accordance with characteristics of the transistor to be used.

7. The semiconductor device according to claim 3, wherein the gap difference between gate electrodes is changed by providing a transistor instead of a dummy gate electrode, thereby changing the width of the side wall spacer.

8. The semiconductor device according to claim 5, wherein the dummy electrode is provided in the vicinity of one of the opposite sides of the desired gate electrode so that the opposite sides of the side wall spacer have widths that are different from each other.

9. The semiconductor device according to claim 3, wherein the desired gate electrode comprises a first and second intersecting portions spaced from each other and integrally connected to have a U-letter shape on top plan view and the first and second intersecting portions are placed on a semiconductor substrate to intersect an active region and wherein opposite sides of the side wall spacer of the first and second intersecting portions have widths that are different from each other.

* * * * *